US010964555B2

(12) United States Patent
Hanajima

(10) Patent No.: US 10,964,555 B2
(45) Date of Patent: Mar. 30, 2021

(54) WATER JET PROCESSING APPARATUS

(71) Applicant: DISCO CORPORATION, Tokyo (JP)

(72) Inventor: Satoshi Hanajima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 289 days.

(21) Appl. No.: 15/959,876

(22) Filed: Apr. 23, 2018

(65) Prior Publication Data

US 2018/0308717 A1 Oct. 25, 2018

(30) Foreign Application Priority Data

Apr. 24, 2017 (JP) ............................. JP2017-085550

(51) Int. Cl.

| *H01L 21/67* | (2006.01) |
|---|---|
| *B08B 3/02* | (2006.01) |
| *H01L 21/68* | (2006.01) |

(52) U.S. Cl.
CPC ........ *H01L 21/67051* (2013.01); *B08B 3/022* (2013.01); *B08B 3/024* (2013.01); *H01L 21/68* (2013.01)

(58) Field of Classification Search
CPC ............................................... H01L 21/67051
See application file for complete search history.

(56) References Cited

U.S. PATENT DOCUMENTS

2015/0034133 A1* 2/2015 Kim .................. H01L 21/67051
134/105

FOREIGN PATENT DOCUMENTS

| JP | 2016157722 A | 9/2016 |
|---|---|---|
| JP | 2016181569 A | 10/2016 |

* cited by examiner

*Primary Examiner* — Jason Y Ko
(74) *Attorney, Agent, or Firm* — Greer Burns & Crain Ltd.

(57) ABSTRACT

Disclosed herein is a water jet processing apparatus including a chuck table that holds a workpiece by a holding surface, a high-pressure water injection unit having a high-pressure water nozzle that injects high-pressure water along planned dividing lines of the workpiece to remove burrs, a processing feed unit that carries out processing feed of the chuck table in an X-direction, and an indexing feed unit that carries out indexing feed of the high-pressure water nozzle in a Y-direction. The water jet processing apparatus also includes a movement unit that moves the high-pressure water nozzle in a Z-direction, an alignment unit that images the workpiece, a cassette placement region in which a cassette that houses plural workpieces is placed, and a conveying unit that conveys the workpiece between the cassette and the chuck table.

9 Claims, 8 Drawing Sheets

WATER JET PROCESSING APPARATUS

BACKGROUND OF THE INVENTION

Field of the Invention

The present invention relates to a water jet processing apparatus.

Description of the Related Art

A package substrate in which semiconductor devices and so forth are mounted on a substrate made of a resin or a metal on which electrodes are wired and the semiconductor devices are covered by a mold resin is known. When being divided into individual device chips along planned dividing lines, the package substrate becomes package chips called chip size package (CSP), quad flat non-leaded package (QFN), or the like.

In the above-described package chip, metal electrodes are exposed along the planned dividing line in many cases. For this reason, when the planned dividing line of the package substrate is cut by a cutting blade, burrs of the metal are generated, and possibly electrodes are electrically coupled to each other and short-circuiting occurs. Therefore, for the purpose of burr removal, a processing method in which high-pressure water is injected toward burrs has been devised and a processing apparatus has been proposed in which a high-pressure water nozzle is fixed adjacent to a cutting unit in such a manner that the high-pressure water nozzle that injects high-pressure water is located beside a cutting blade (for example, refer to Japanese Patent Laid-Open No. 2016-157722 and Japanese Patent Laid-Open No. 2016-181569).

SUMMARY OF THE INVENTION

However, in the processing apparatus described in Japanese Patent Laid-Open No. 2016-157722 and Japanese Patent Laid-Open No. 2016-181569, the high-pressure water nozzle is fixed adjacent to the cutting unit and a large difference exists between the time required for cutting processing by the cutting blade and the time required for processing of removing adhering objects such as burrs by the high-pressure water nozzle, which results in inefficient processing.

Thus, an object of the present invention is to provide a water jet processing apparatus that can efficiently remove adhering objects of planned dividing lines.

In accordance with an aspect of the present invention, there is provided a water jet processing apparatus including a chuck table that holds a workpiece by a holding surface, a high-pressure water injection unit having a high-pressure water nozzle that injects high-pressure water along planned dividing lines of the workpiece held by the chuck table to remove adhering objects of the planned dividing lines, a processing feed unit that carries out processing feed of the chuck table in an X-direction parallel to the holding surface, and an indexing feed unit that carries out indexing feed of the high-pressure water nozzle in a Y-direction parallel to the holding surface. The water jet processing apparatus also includes a movement unit that moves the high-pressure water nozzle in a Z-direction along which the high-pressure water nozzle gets closer to or farther away from the holding surface, an alignment unit that images the workpiece held by the chuck table and detects the planned dividing line, a cassette placement region in which a cassette that houses a plurality of workpieces is placed, and a conveying unit that conveys the workpiece between the cassette placed in the cassette placement region and the chuck table.

Preferably, the high-pressure water nozzle includes a first high-pressure water nozzle and a second high-pressure water nozzle that are each singly subjected to indexing feed on the same straight line that extends along the Y-direction.

Preferably, the water jet processing apparatus further includes a scattering object suction unit having a blocking part that surrounds and covers a tip part of the high-pressure water nozzle and has a cylindrical shape or a dome shape, and a suction part that communicates with the blocking part and sucks scattering objects generated due to injection of the high-pressure water.

Preferably, the water jet processing apparatus further includes a processing feed unit cover that covers the processing feed unit at both sides of the chuck table and is made of a metal.

Preferably, the water jet processing apparatus further includes a cleaning unit that cleans the workpiece that is held by the chuck table and has been subjected to injection of the high-pressure water from the high-pressure water nozzle.

The water jet processing apparatus of the invention of the present application provides an effect that the adhering objects of the planned dividing lines can be efficiently removed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Modes (embodiments) for carrying out the present invention will be described in detail with reference to the drawings. The present invention is not limited by the contents described in the following embodiments. Furthermore, in constituent elements described below, what can be easily envisaged by those skilled in the art and what are substantially the same are included. Moreover, configurations described below can be combined as appropriate. In addition, various kinds of omission, replacement, or change can be carried out without departing from the gist of the present invention.

Figure 2:
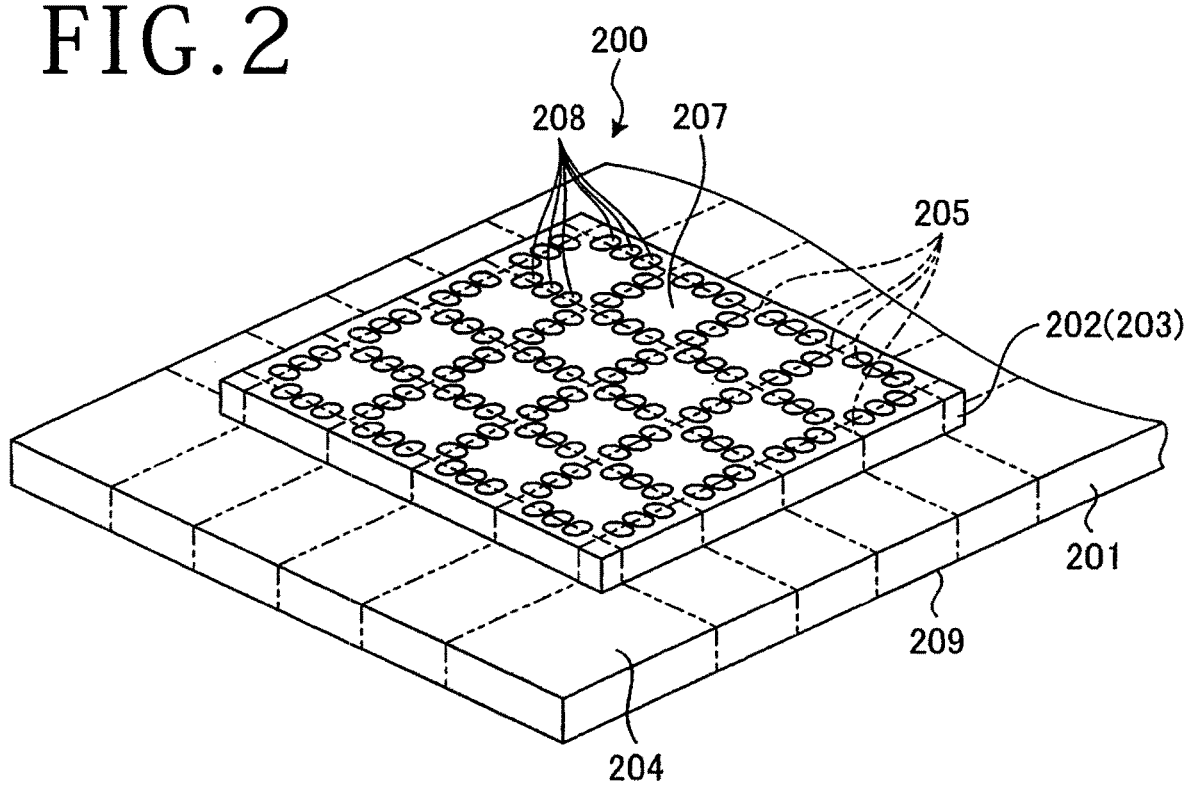
FIG. 2 is a perspective view of a workpiece of a processing target of the water jet processing apparatus according to the first embodiment.

A water jet processing apparatus 1 according to a first embodiment is an apparatus that processes a workpiece 200 depicted in FIG. 2. In the first embodiment, the workpiece 200 is a package substrate including CSP, QFN, or the like as depicted in FIG. 2. The workpiece 200 is formed into a substantially rectangular plate shape by arranging plural semiconductor devices into which circuits such as an integrated circuit (IC) or large scale integration (LSI) are fabricated and sealing the semiconductor devices by a mold resin or the like. Specifically, in the workpiece 200, plural semiconductor devices are arranged on a surface of a resin substrate 201 that is formed of a printed circuit board or the like and has a rectangular shape and plural projection parts 202 configured by a mold resin that seals the semiconductor devices are lined up in the longitudinal direction of the resin substrate 201. Although the workpiece 200 includes two projection parts 202 in the embodiment, the number of projection parts 202 is not limited to two. The mold resin that configures the projection parts 202 is formed of an epoxy resin or a silicone resin. However, the mold resin that configures the projection parts 202 is not limited to them.

The workpiece 200 is separated into plural device regions 203 formed of the projection parts 202 and a surplus region 204 around the device regions 203. Each device region 203 is segmented into plural regions by planned dividing lines 205 in a lattice manner depicted by a two-dot-chain line in FIG. 2 and the above-described semiconductor device, which is not depicted in the diagram, is disposed in each region. The planned dividing lines 205 are provided over both the device regions 203 and the surplus region 204 continuously.

Figure 3:
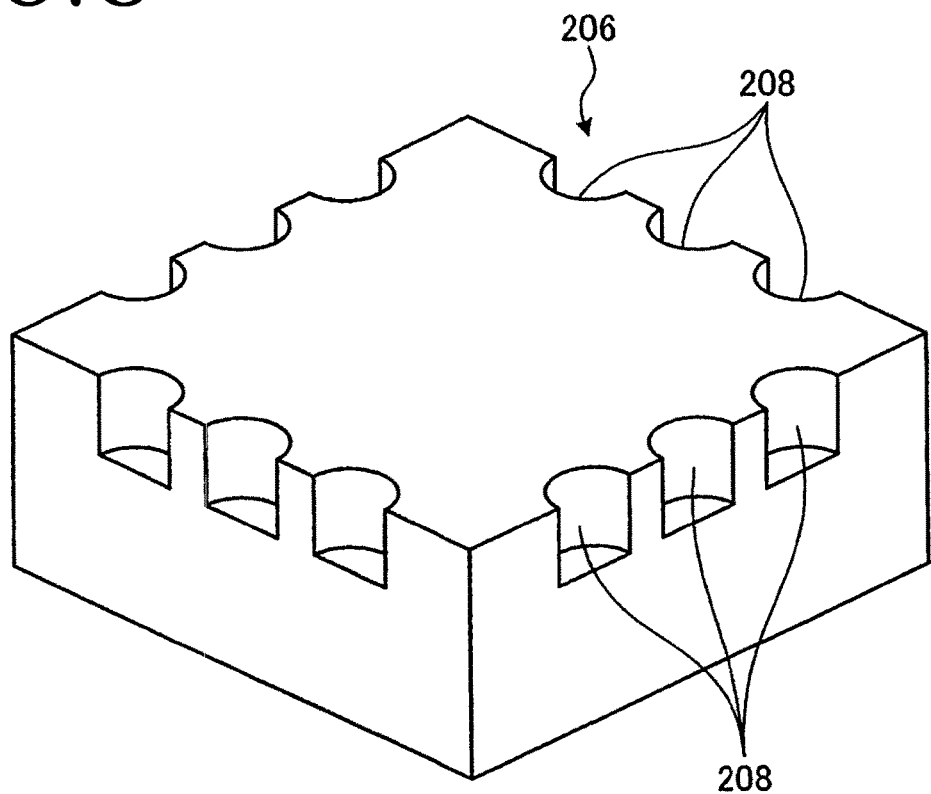
FIG. 3 is a perspective view depicting a device chip obtained through dividing of the workpiece depicted in FIG. 2.

The workpiece 200 is divided along the planned dividing lines 205 and is divided into individual device chips 206 depicted in FIG. 3. Furthermore, in a front surface 207 of the device regions 203, recesses 208 having a predetermined depth are formed across the planned dividing line 205. The recesses 208 have an elongated hole shape that extends along the direction orthogonal to the planned dividing line 205 and are disposed around each semiconductor device. In the first embodiment, the recesses 208 have dimensions of 400 μm as the length in the long direction and 100 μm as the width in the short direction and are formed into the predetermined depth. In the recesses 208, electrodes are formed after the workpiece 200 is divided into the individual device chips 206 and these electrodes function as recess electrodes that serve as connection terminals to the circuit formed in the chip. The recesses 208 are halved along the planned dividing line 205 if the workpiece 200 is divided into the individual device chips 206.

Figure 1:
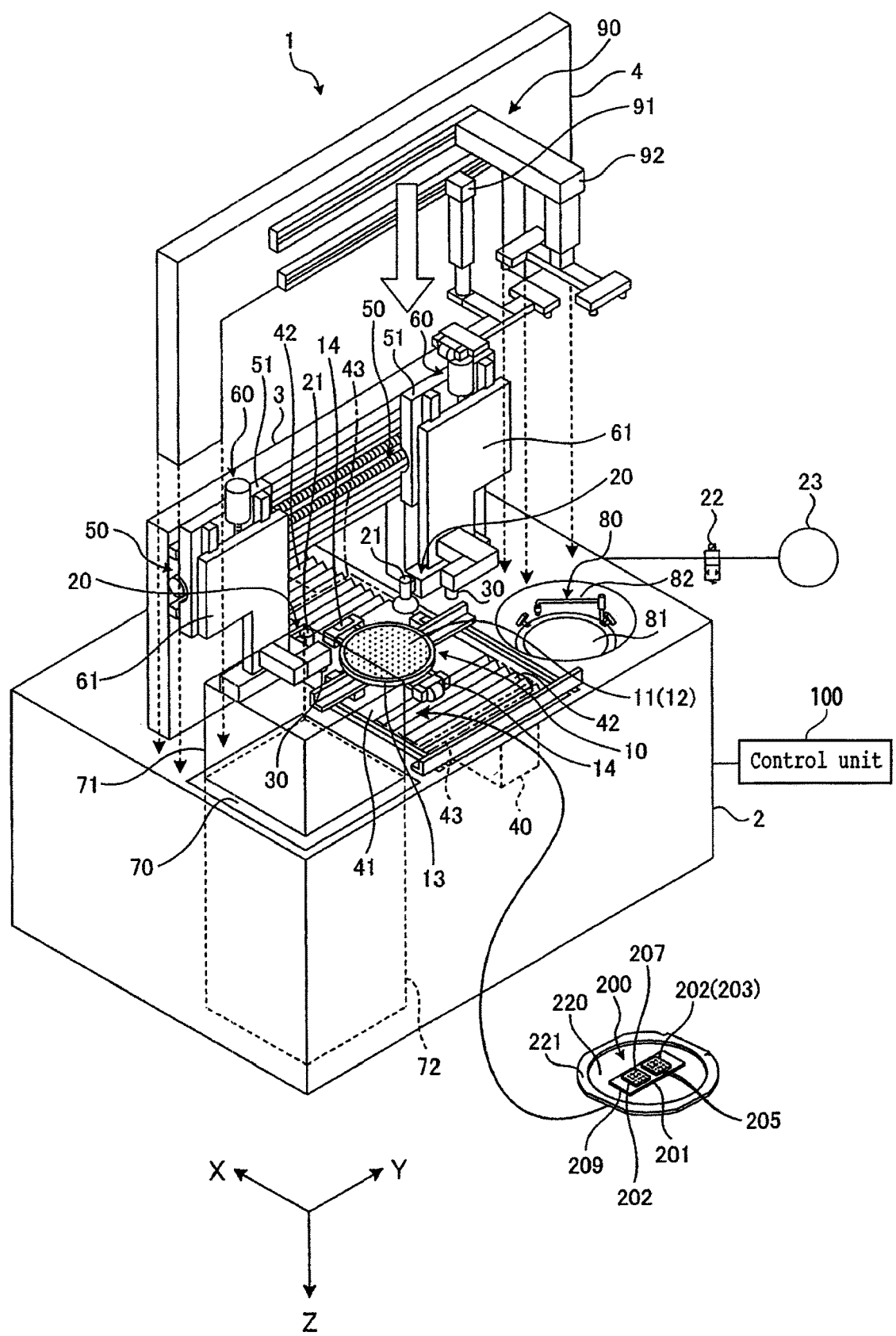
FIG. 1 is a perspective view depicting a configuration example of a water jet processing apparatus according to a first embodiment.
Figure 4:
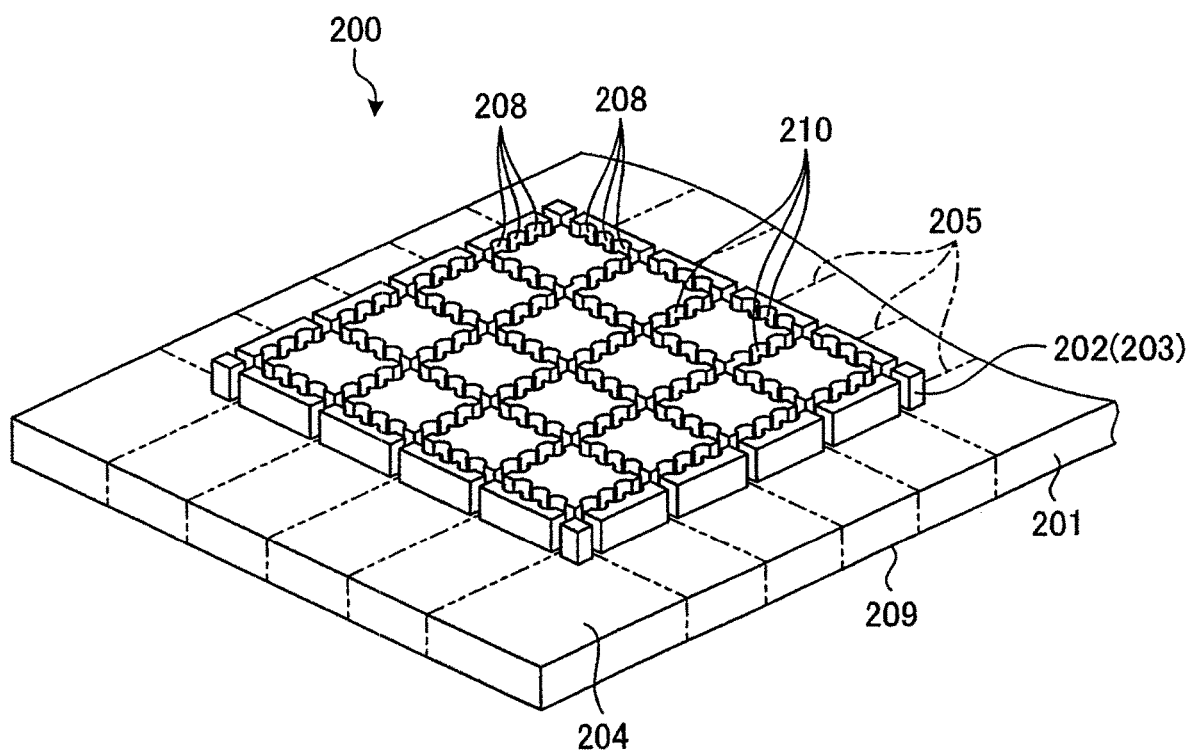
FIG. 4 is a perspective view of the state in which half-cut grooves have been formed in the workpiece depicted in FIG. 2.
Figure 5:
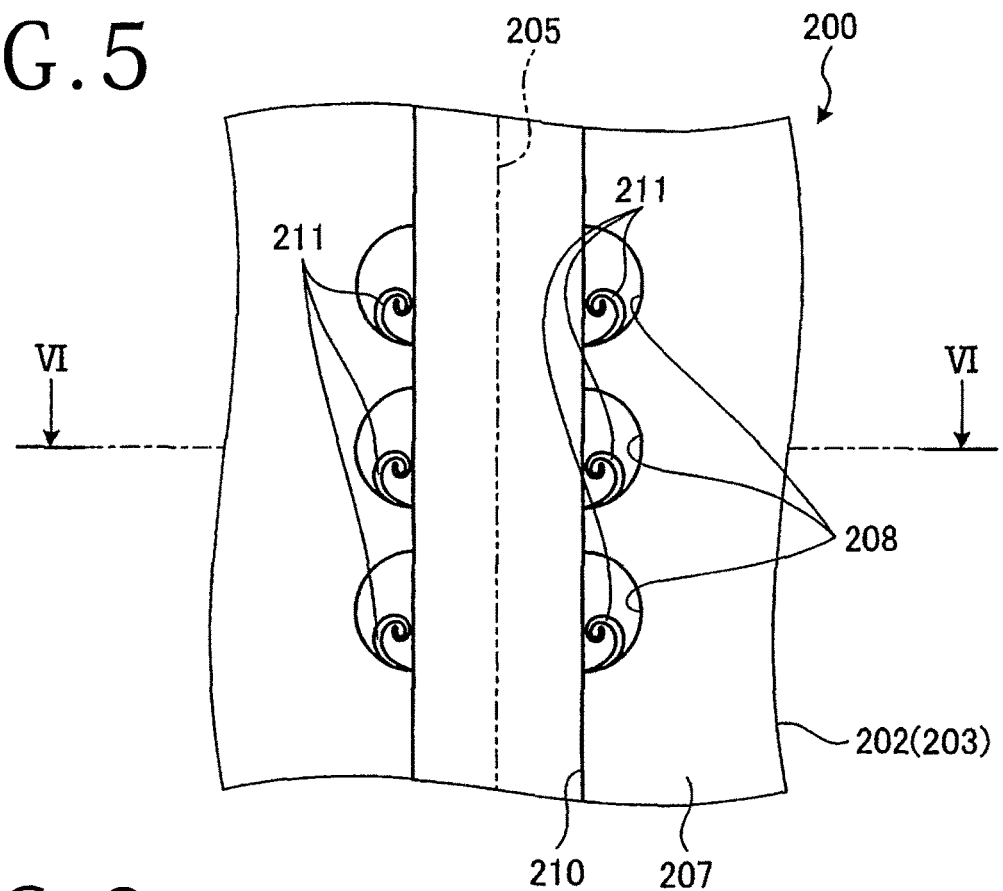
FIG. 5 is a plan view of the major part of the workpiece depicted in FIG. 4.
Figure 6:
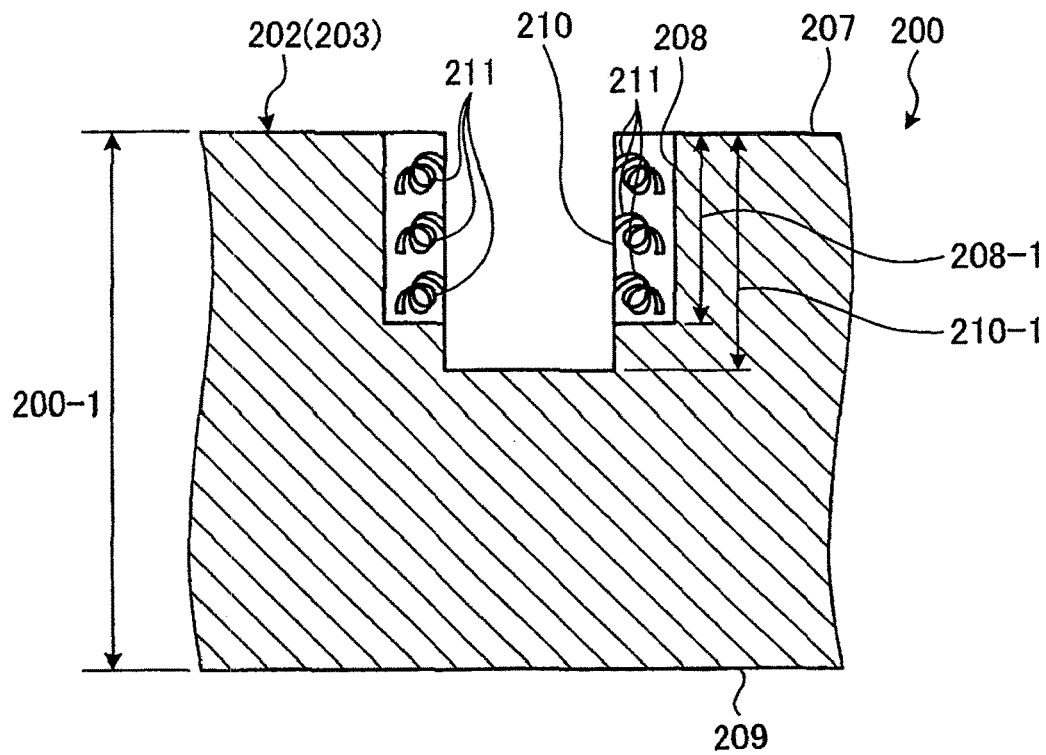
FIG. 6 is a sectional view along line VI-VI in FIG. 5.

As depicted in FIG. 1, for the workpiece 200, an adhesive tape 220 is stuck to a back surface 209 and a ring-shaped frame 221 is stuck to the outer circumference of the adhesive tape 220. Thereby, the workpiece 200 is carried in to the water jet processing apparatus 1 in the state of being integrated with the ring-shaped frame 221. Furthermore, in the first embodiment, as depicted in FIG. 4 and FIG. 5, the workpiece 200 is carried in to the water jet processing apparatus 1 in the state in which half-cut grooves 210 have been formed by cutting processing from the side of the front surface 207 of the device regions 203 along the planned dividing lines 205. In the first embodiment, as depicted in FIG. 6, the half-cut grooves 210 are formed with a depth 210-1 that is larger than a depth 208-1 of the recesses 208 and does not surpass a thickness 200-1 of the workpiece 200.

Figure 7:
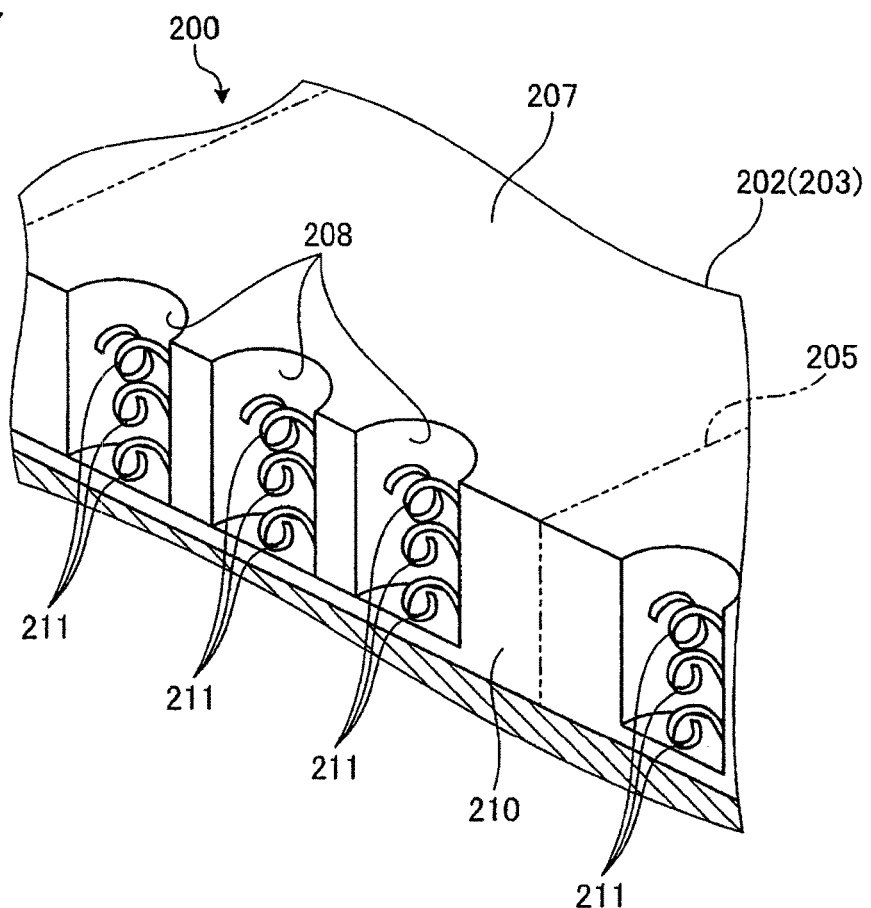
FIG. 7 is a perspective view depicting the major part of the workpiece depicted in FIG. 4 by a partial section.

In the workpiece 200, when the half-cut groove 210 is formed from the side of the front surface 207 of the device region 203 along the planned dividing line 205, the recesses 208 are split into a shape with a semicircular shape in top view by the half-cut groove 210 as depicted in FIG. 5 and FIG. 7 and the recesses 208 are exposed in the cut plane of the workpiece 200. The recesses 208 function as the recess electrodes as described above. Because the half-cut groove 210 is formed by cutting processing, burrs 211 that are plural adhering objects are formed in the cut plane of the half-cut groove 210, particularly at the edge parts of the recesses 208, as depicted in FIG. 5, FIG. 6, and FIG. 7. The burrs 211 extend in the processing feed direction of the cutting processing. Specifically, with the edge parts of the recesses 208 on the front side in the processing feed direction of the cutting processing being the base ends, the burrs 211 are formed to curl along the inside surfaces of the recesses 208 and have a shape that swirls in a whisker manner. As described above, electrodes are formed in the recesses 208 in a later manufacturing step. Therefore, if the manufacturing step progresses while the burrs 211 remain formed, it becomes difficult to properly form the electrodes. For this reason, the burrs 211 around the recesses 208 are removed after the half-cut grooves 210 are formed.

Figure 8:
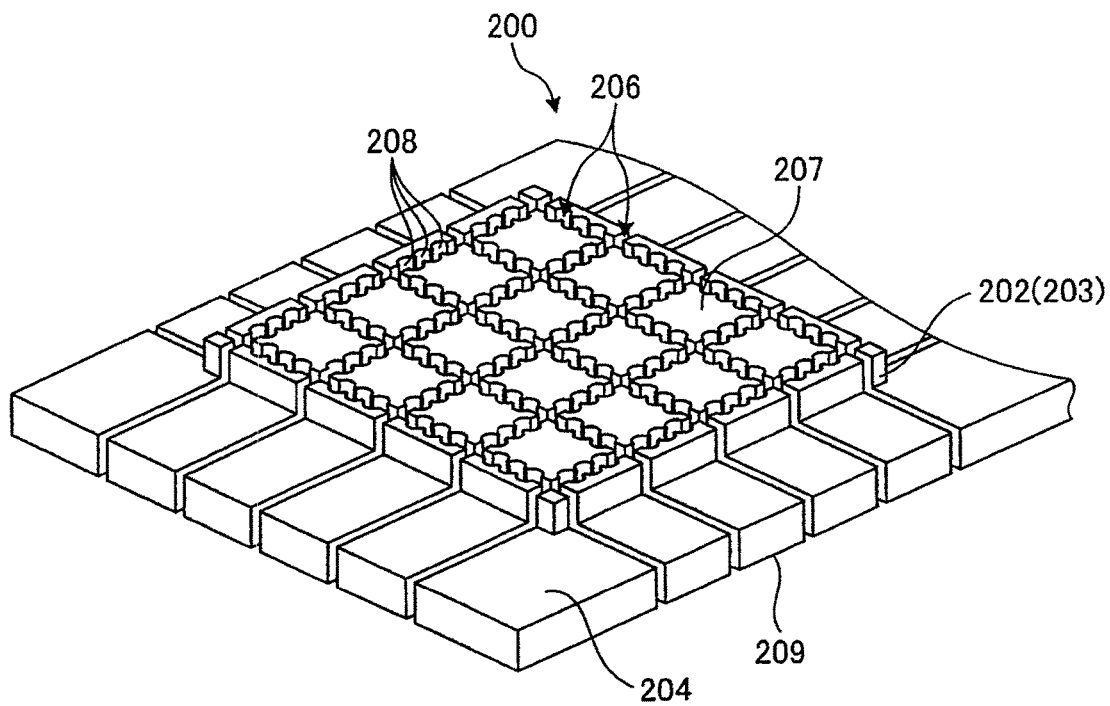
FIG. 8 is a perspective view of the state in which the workpiece depicted in FIG. 4 has been fully cut.

After the half-cut grooves 210 are formed and the burrs 211 are removed, as depicted in FIG. 8, cutting processing is carried out on the bottoms of the half-cut grooves 210 and the workpiece 200 is fully cut. The workpiece 200 is divided into the individual device chips 206 depicted in FIG. 3 through being fully cut. After the workpiece 200 is divided into the individual device chips 206, the surplus region 204 is removed as an end material. Furthermore, the recesses 208 are exposed in the cut planes of the device chips 206 as depicted in FIG. 3.

Figure 9:
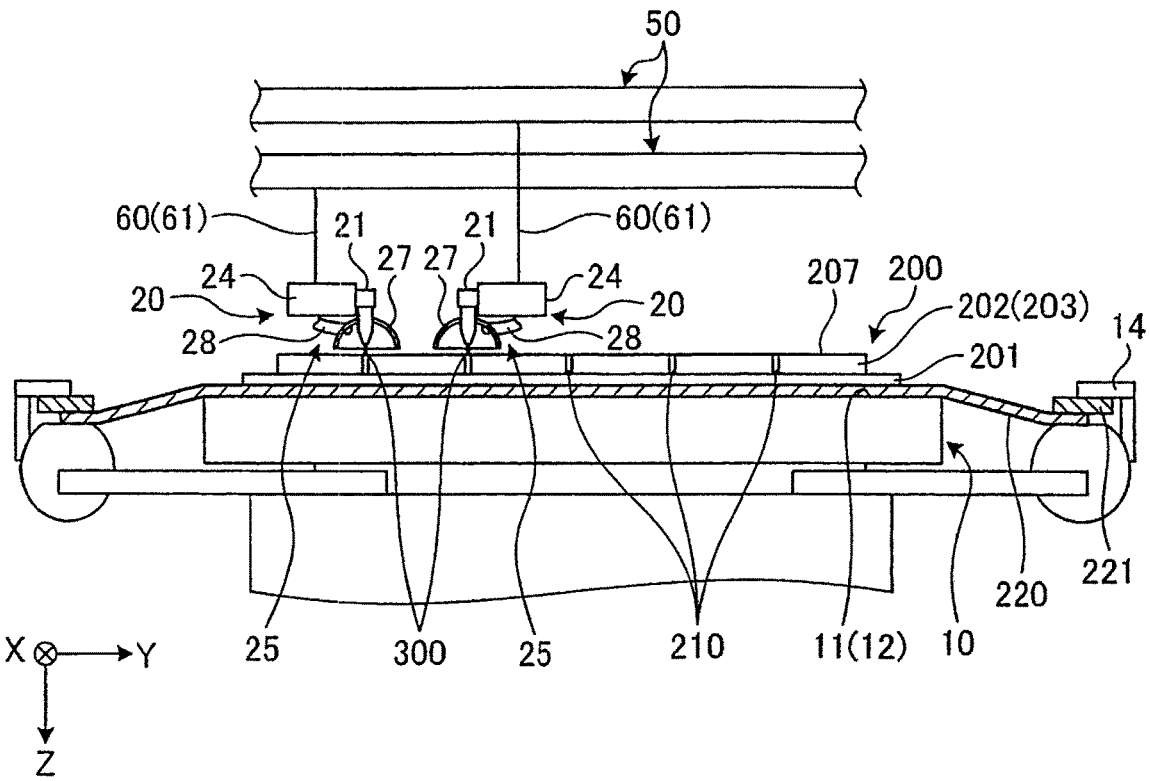
FIG. 9 is a front view schematically depicting the positional relationship between two high-pressure water injection units of the water jet processing apparatus according to the first embodiment.
Figure 10:
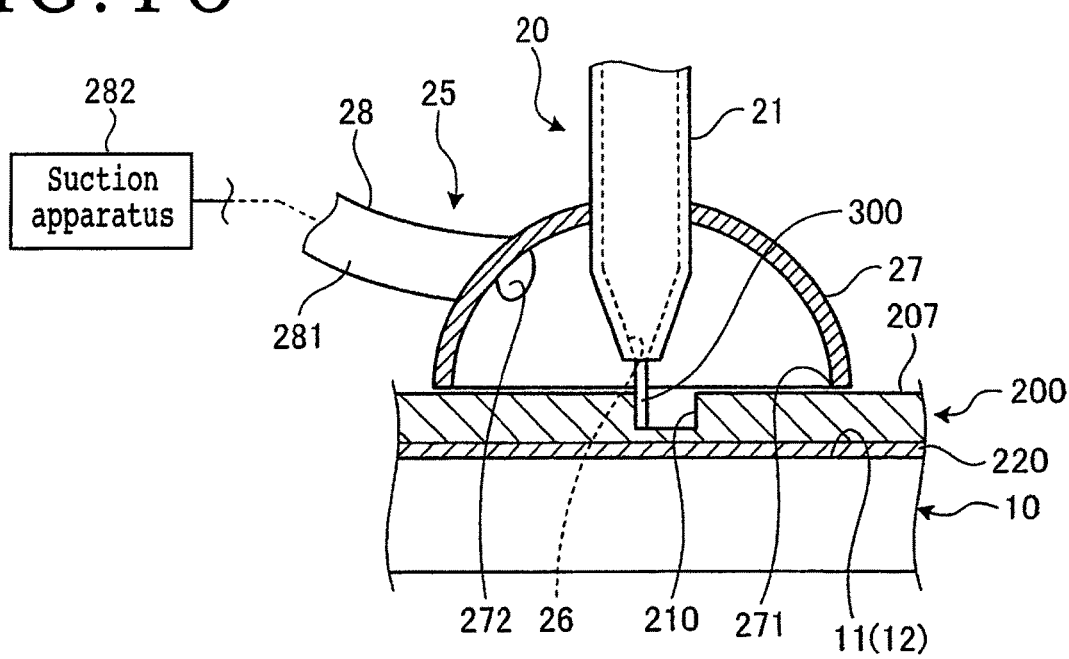
FIG. 10 is a sectional view depicting the state in processing by the high-pressure water injection unit of the water jet processing apparatus according to the first embodiment.

The water jet processing apparatus 1 according to the first embodiment is an apparatus that removes the burrs 211 formed in the cut planes of the half-cut grooves 210 of the workpiece 200. FIG. 9 is a front view schematically depicting the positional relationship between two high-pressure water injection units of the water jet processing apparatus according to the first embodiment. FIG. 10 is a sectional view depicting the state in processing by the high-pressure water injection unit of the water jet processing apparatus according to the first embodiment.

As depicted in FIG. 1, the water jet processing apparatus 1 includes a chuck table 10 that holds the workpiece 200 by suction by a holding surface 11, high-pressure water injection units 20 that inject high-pressure water 300 depicted in FIG. 9 and FIG. 10 along the planned dividing lines 205 of the workpiece 200 held by the chuck table 10, alignment units 30 that image the workpiece 200 held by the chuck table 10 and detect the planned dividing line 205, and a control unit 100.

Furthermore, as depicted in FIG. 1, the water jet processing apparatus 1 includes at least a processing feed unit 40 that carries out processing feed of the chuck table 10 in an X-direction parallel to the holding surface 11, indexing feed units 50 that carry out indexing feed of high-pressure water nozzles 21 of the high-pressure water injection units 20 in a Y-direction that is parallel to the holding surface 11 and is orthogonal to the X-direction, movement units 60 that move the high-pressure water nozzles 21 of the high-pressure water injection units 20 in a Z-direction parallel to the vertical direction along which the high-pressure water nozzles 21 get closer to or farther away from the holding surface 11, a cassette placement region 70 in which a cassette 71 that houses plural workpieces 200 is placed, a cleaning unit 80, and a conveying unit 90 that conveys the workpiece 200.

The chuck table 10 has a circular disc shape having a holding part 12 that is provided with the holding surface 11 to hold the workpiece 200 and is formed of porous ceramic or the like, and a ring-shaped frame part 13 that surrounds the holding part 12. Furthermore, the chuck table 10 is provided movably in the X-direction by the processing feed unit 40 and rotatably around an axial center parallel to the Z-direction by a rotational drive source, which is not depicted in the diagram. The chuck table 10 is connected to a vacuum suction source, which is not depicted in the diagram, and is sucked by the vacuum suction source to suck and hold the workpiece 200. Plural clamp parts 14 that clamp the ring-shaped frame 221 are provided around the chuck table 10. Furthermore, the chuck table 10 is disposed on a movement table 41 moved in the X-direction by the processing feed unit 40.

The processing feed unit 40 carries out processing feed of the chuck table 10 in the X-direction by moving the movement table 41 in the X-direction. The processing feed unit 40 is covered by two accordion members 42 that are attached to both sides of the movement table 41 in the X-direction and are expandable and contractible. Furthermore, the accordion members 42 are each covered by a processing feed unit cover 43 depicted by a two-dot chain line in FIG. 1.

The processing feed unit covers 43 are metal members and are formed into a flat plate shape parallel to both the X-direction and the Y-direction. The processing feed unit covers 43 are attached to both sides of the movement table 41 in the X-direction and are disposed at both sides of the chuck table 10. Furthermore, the processing feed unit covers 43 are made to overlap above the accordion members 42 and cover the processing feed unit 40 with the intermediary of the accordion members 42.

The indexing feed units 50 are provided as two units on a gate-shaped upright member 3 provided upright from an apparatus main body 2. The two indexing feed units 50 carry out indexing feed of the high-pressure water injection units 20 in the Y-direction by moving Y-direction movement tables 51 in the Y-direction independently of each other.

The movement units 60 are provided as two units and correspond to the indexing feed units 50 in a one-to-one relationship. The movement units 60 are each provided on the Y-direction movement table 51 of the corresponding indexing feed unit 50. The two movement units 60 move the high-pressure water injection units 20 in the Z-direction by moving Z-direction movement tables 61 in the Z-direction independently of each other.

The processing feed unit 40, the indexing feed units 50, and the movement units 60 each include a well-known ball screw provided rotatably around an axial center, a well-known pulse motor that rotates the ball screw around the axial center, and a well-known guide rail that supports the chuck table 10 or the high-pressure water injection unit 20 movably in the X-direction, the Y-direction, or the Z-direction.

The high-pressure water injection units 20 inject the high-pressure water 300 to remove the burrs 211 formed in the cut planes of the half-cut grooves 210 formed along the planned dividing lines 205 of the workpiece 200 from the cut planes. The high-pressure water injection units 20 are provided as two units and correspond to the movement units 60 in a one-to-one relationship. The two high-pressure water injection units 20 include the high-pressure water nozzles 21 that inject the high-pressure water 300 to remove the burrs 211. The high-pressure water nozzles 21 of the high-pressure water injection units 20 inject the high-pressure water 300 supplied from a high-pressure water supply unit 23 via an open-close valve 22.

In the first embodiment, the high-pressure water supply unit 23 is formed of a plunger pump. However, the high-pressure water supply unit 23 is not limited to the plunger pump in the present invention. In the first embodiment, the high-pressure water injection units 20 inject the high-pressure water 300 composed of pure water that is pressurized by the high-pressure water supply unit 23 and does not include abrasive grains from the high-pressure water nozzles 21. In the first embodiment, the high-pressure water 300 injected from the high-pressure water nozzles 21 is pressurized to approximately 20 MPa (gauge pressure) to 60 MPa (gauge pressure).

The two high-pressure water injection units 20 are attached to the lower ends of the Z-direction movement tables 61 of the corresponding movement units 60 in the state in which the high-pressure water nozzles 21 are opposed to each other. Because being attached to the lower ends of the Z-direction movement tables 61 of the corresponding movement units 60, the two high-pressure water injection units 20 can move in the Y-direction and the Z-direction independently of each other.

Furthermore, one high-pressure water nozzle 21 in the two high-pressure water injection units 20 is a first high-pressure water nozzle and the other high-pressure water nozzle 21 is a second high-pressure water nozzle. Thus, the water jet processing apparatus 1 includes the first high-pressure water nozzle and the second high-pressure water nozzle as the high-pressure water nozzles 21. Moreover, due to the attachment of the two high-pressure water injection units 20 to the lower ends of the Z-direction movement tables 61 in the state in which the high-pressure water nozzles 21 are opposed to each other, the first high-pressure water nozzle and the second high-pressure water nozzle are disposed on the same straight line that extends along the Y-direction when the positions in the Z-direction are aligned with each other as depicted in FIG. 9. In addition, due to the attachment to the lower ends of the Z-direction movement tables 61 of the corresponding movement units 60, the two high-pressure water injection units 20 are each subjected to indexing feed singly (independently).

As depicted in FIG. 9, the high-pressure water injection units 20 each include a unit main body 24 attached to the lower end of the Z-direction movement table 61, the high-pressure water nozzle 21 provided at the tip of the unit main body 24, and a scattering object suction unit 25.

As depicted in FIG. 10, the high-pressure water nozzle 21 includes an injection port 26 that is opposed to the chuck table 10 and injects the high-pressure water 300. The scattering object suction unit 25 sucks scattering objects of the burrs 211, the high-pressure water 300, and so forth generated due to injection of the high-pressure water 300. The scattering object suction unit 25 includes a dome-shaped blocking part 27 and a suction part 28. The blocking part 27 is formed into a dome shape in which an opening 271 is made on the lower side and is attached to the outer circumference of the tip part of the high-pressure water nozzle 21 to cover the periphery of the injection port 26. In the blocking part 27, a suction port 272 is made and the part other than the opening 271 and the suction port 272, including the place attached to the high-pressure water nozzle 21, is closed to surround and cover the tip part of the high-pressure water nozzle 21.

The suction part 28 communicates with the inside of the blocking part 27 and sucks scattering objects of the burrs 211, the high-pressure water 300, and so forth generated due to injection of the high-pressure water 300. The suction part 28 includes a suction pipe 281 attached to the blocking part 27 in such a manner as to communicate with the suction port 272 and a suction apparatus 282 attached to the suction pipe 281. The suction apparatus 282 sucks the inside of the blocking part 27 through the suction pipe 281 and the suction port 272 and thereby the suction part 28 suppresses the situation in which the processing chamber marked out to surround the chuck table 10 and the high-pressure water nozzle 21 is filled with scattering objects and the atmosphere containing scattering objects leaking from the processing chamber adhere to the respective shaft parts and so forth.

The alignment units 30 are each fixed to a respective one of the Z-direction movement tables 61 of the movement units 60 so as to move integrally with the respective one of the Z-direction movement tables 61 of the movement units 60. The alignment units 30 include a charge coupled device (CCD) camera that images the workpiece 200 held by the chuck table 10 and detects the half-cut groove 210 formed along the planned dividing line 205 of the workpiece 200.

The alignment units 30 carry out imaging of an image for performing alignment in which position adjustment between the workpiece 200 and the high-pressure water nozzle 21 is carried out and output the image obtained by the imaging to the control unit 100.

The cassette 71 placed in the cassette placement region 70 houses the workpieces 200 to which the high-pressure water 300 has not been injected and the workpieces 200 to which the high-pressure water 300 has been injected. The cassette placement region 70 is moved in the Z-direction by a cassette elevator 72 provided in the apparatus main body 2. Thus, the cassette 71 is moved in the Z-direction by the cassette elevator 72.

A cleaning unit 80 cleans the workpiece 200 to which the high-pressure water 300 has been injected from the high-pressure water nozzle 21. The cleaning unit 80 includes a spinner table 81 that holds the workpiece 200 by suction and rotates around an axial center parallel to the Z-direction and a cleaning water nozzle 82 that injects cleaning water to the workpiece 200 held by suction by the spinner table 81 that rotates around the axial center. Furthermore, the cleaning unit 80 completely removes, from the workpiece 200, the burrs 21 that have been removed from the planned dividing lines 205 by the high-pressure water 300 but adhered to the workpiece 200 again.

The conveying unit 90 is provided on a second upright member 4 that is attached to the apparatus main body 2 and has a gate shape. The conveying unit 90 includes a first conveying unit 91 and a second conveying unit 92. The first conveying unit 91 conveys the workpiece 200 between the cassette 71 and the chuck table 10. The second conveying unit 92 conveys the workpiece 200 between the chuck table 10 and the spinner table 81 of the cleaning unit 80.

The control unit 100 controls each of the above-described constituent elements to cause the water jet processing apparatus 1 to carry out processing operation to the workpiece 200. The control unit 100 is a computer. The control unit 100 includes an arithmetic processing apparatus having a microprocessor such as a central processing unit (CPU), a storing apparatus having a memory such as a read only memory (ROM) or a random access memory (RAM), and an input-output interface apparatus. The arithmetic processing apparatus of the control unit 100 executes arithmetic processing in accordance with a computer program stored in the storing apparatus and outputs a control signal for controlling the water jet processing apparatus 1 to the above-described constituent elements of the water jet processing apparatus 1 through the input-output interface apparatus.

The control unit 100 is connected to a display apparatus formed of a liquid crystal display apparatus or the like that displays the state of processing operation, an image, and so forth and an input apparatus used when an operator registers information on the contents of processing and so forth. The input apparatus is formed of at least one of a touch panel provided in the display apparatus and external input apparatuses such as a keyboard.

Next, the processing operation of the water jet processing apparatus 1 will be described. First, an operator integrates the workpiece 200 in which the half-cut grooves 210 have been formed with the ring-shaped frame 221 to house the workpiece 200 in the cassette 71 and place the cassette 71 in the cassette placement region 70. The water jet processing apparatus 1 starts the processing operation when the operator registers information on the contents of the processing in the control unit 100 and an instruction to start the processing operation is made from the operator. In the processing operation, the control unit 100 extracts one workpiece 200 to which the high-pressure water 300 has not been injected from the cassette 71 and places the workpiece 200 on the holding surface 11 of the chuck table 10 by the conveying unit 90 to hold the workpiece 200 by suction on the holding surface 11 of the chuck table 10.

Next, the control unit 100 moves the chuck table 10 toward the lower side of the alignment unit 30 by the processing feed unit 40 and positions the workpiece 200 held by the chuck table 10 below the alignment unit 30. Then, the control unit 100 causes the alignment unit 30 to carry out imaging and performs alignment.

Then, based on the information on the contents of the processing, the control unit 100 removes the burrs 211 by injecting the high-pressure water 300 from the high-pressure water nozzles 21 toward both edges of the half-cut grooves 210 formed along the planned dividing lines 205 of the workpiece 200 as depicted in FIG. 10 while relatively moving the high-pressure water nozzles 21 of the two high-pressure water injection units 20 independently of each other along the planned dividing lines 205 by the processing feed unit 40, the indexing feed units 50, the movement units 60, and the rotational drive source. Scattering objects generated when the burrs 211 are removed are sucked by the suction part 28. Thus, the scattering objects neither scatter around the chuck table 10 nor adhere to the workpiece 200.

When the high-pressure water 300 is injected, the movement unit 60 adjusts the distance in the Z-direction between the high-pressure water nozzle 21 and the workpiece 200 and controls the power of the high-pressure water 300 to contribute to selection of a condition under which the burrs 211 can be removed without breaking of the adhesive tape 220 and the workpiece 200.

After injecting the high-pressure water 300 to both edges of the half-cut grooves 210 formed along all planned dividing lines 205, the control unit 100 stops the high-pressure water 300 from the high-pressure water nozzles 21 and evacuates the chuck table 10 from the lower side of the high-pressure water injection units 20 and thereafter releases the holding of the chuck table 10 by suction. Then, the control unit 100 conveys the workpiece 200 to which the high-pressure water 300 has been injected to the cleaning unit 80 by using the conveying unit 90 and cleans the workpiece 200 by the cleaning unit 80. Then, the control unit 100 houses the cleaned workpiece 200 in the cassette 71. The control unit 100 places the workpiece 200 to which the high-pressure water 300 has not been injected on the chuck table 10 again and repeats the above-described steps to remove the burrs 211 made in the half-cut grooves 210 of the planned dividing lines 205 of all workpieces 200 in the cassette 71.

Figure 11:
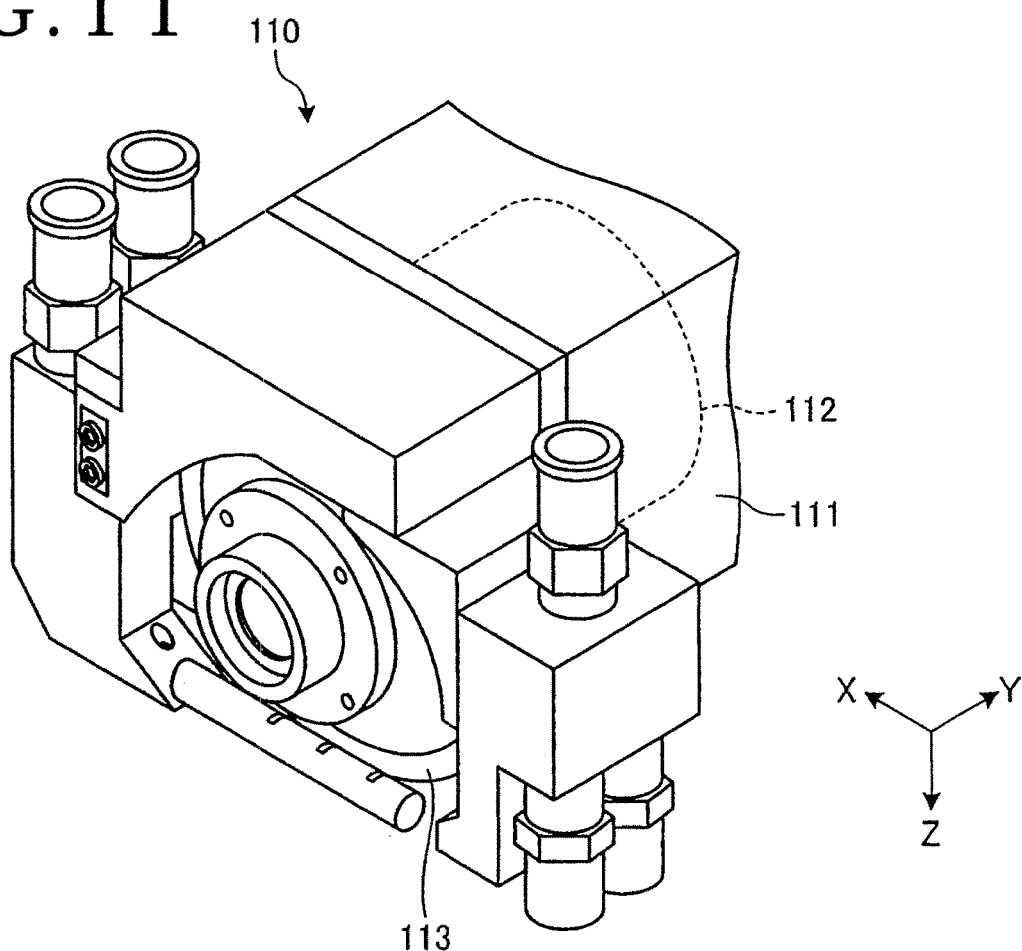
FIG. 11 is a perspective view of the major part of a cutting unit that can be attached to the lower end of a Z-direction movement table of the water jet processing apparatus depicted in FIG. 1.

In the above-described water jet processing apparatus 1, the high-pressure water injection unit 20 can be detached from the Z-direction movement table 61 and a cutting unit 110 depicted in FIG. 11 can be attached. FIG. 11 is a perspective view of the major part of the cutting unit that can be attached to the lower end of the Z-direction movement table of the water jet processing apparatus depicted in FIG. 1.

The cutting unit 110 carries out cutting processing of the workpiece 200 held by the chuck table 10. The cutting unit 110 includes a spindle housing 111 that can be attached to the lower end of the Z-direction movement table 61, a spindle 112 provided rotatably around an axial center in the spindle housing 111, and a cutting blade 113 that is mounted to the tip of the spindle 112 and carries out cutting processing of the workpiece 200. The cutting units 110 are each provided movably in the Y-direction by the indexing feed unit 50 relatively to the workpiece 200 held by the chuck table 10 and provided movably in the Z-direction by the movement unit 60.

The cutting unit 110 allows the cutting blade 113 to be positioned at an arbitrary position on the holding surface 11 of the chuck table 10 by the indexing feed unit 50 and the movement unit 60. The cutting blade 113 is an extremely-thin cutting abrasive having a substantially ring shape. The spindle 112 rotates the cutting blade 113 to cut the workpiece 200. The axial center of the spindle 112 and the cutting blade 113 of the cutting unit 110 is set parallel to the Y-direction. With indexing feed of the cutting unit 110 in the Y-direction by the indexing feed unit 50, cutting feed of the chuck table 10 in the X-direction is carried out by the processing feed unit 40 and thereby the cutting unit 110 cuts the workpiece 200.

As above, the water jet processing apparatus 1 is configured by detaching the cutting units 110 from the Z-direction movement tables 61 and attaching the high-pressure water injection units 20 to the Z-direction movement tables 61 in a dicing saw including the two cutting units 110, i.e. a two-spindle dicing saw, a cutting apparatus of a so-called facing dual-spindle type.

The water jet processing apparatus 1 according to the first embodiment includes the high-pressure water injection units 20 having the high-pressure water nozzles 21 to remove the burrs 211 as adhering objects that adhere to the half-cut grooves 210 formed along the planned dividing lines 205, the cassette 71 that houses plural workpieces 200, the conveying unit 90 that conveys the workpiece 200 between the cassette 71 and the chuck table 10, and the alignment units 30. This allows the water jet processing apparatus 1 to automatically inject the high-pressure water 300 to the plural workpieces 200 sequentially and thus efficiently carry out the processing by the high-pressure water injection units 20. As a result, the water jet processing apparatus 1 can efficiently remove the burrs 211 made of a metal.

Furthermore, the water jet processing apparatus 1 includes the two high-pressure water injection units 20 that move independently of each other. Thus, even with the workpiece 200 in which the interval of the planned dividing lines 205 is not regular, the high-pressure water 300 can be injected to two planned dividing lines 205 simultaneously and the processing can be efficiently carried out.

Moreover, in the water jet processing apparatus 1, the high-pressure water injection units 20 each include the blocking part 27 and the suction part 28. Thus, spreading of scattering objects of the burrs 211 removed from the planned dividing lines 205 by the high-pressure water 300 and so forth can be suppressed. Furthermore, in the water jet processing apparatus 1, the processing feed unit covers 43 cover the processing feed unit 40. Thus, even if the above-described scattering objects spread, influence on the processing feed unit 40 can be suppressed. Moreover, the water jet processing apparatus 1 includes the cleaning unit 80 to clean the workpiece 200. This provides an effect that the above-described scattering objects can be completely removed from the workpiece 200 by cleaning by the cleaning unit 80 even if the scattering objects spread to adhere to the workpiece 200.

In addition, the water jet processing apparatus 1 only sprays the high-pressure water 300 into the half-cut grooves 210 and does not fully cut the workpiece 200. Therefore, scattering of the device chips 206 can be suppressed. Furthermore, because the water jet processing apparatus 1 only sprays the high-pressure water 300 into the half-cut grooves 210 and does not fully cut the workpiece 200, the workpiece 200 can be conveyed and processed while being fixed by the adhesive tape 220 and therefore an apparatus mechanism similar to that of a normal cutting apparatus (particularly cutting apparatus of a facing dual-spindle type) can be used.

Second Embodiment

Figure 12:
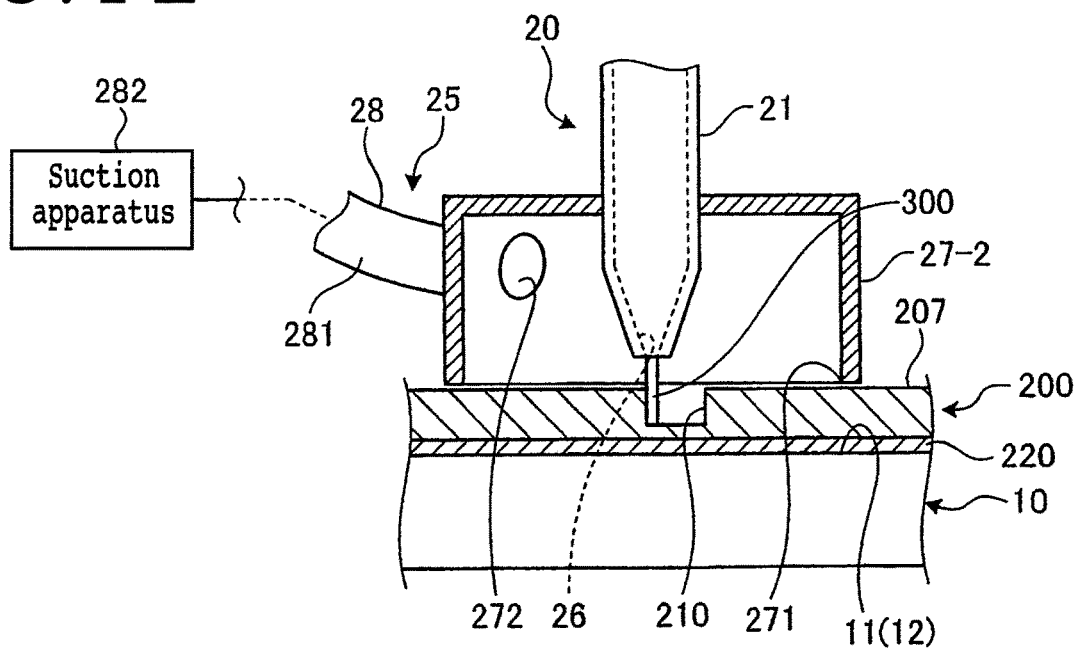
FIG. 12 is a sectional view depicting the state in processing by a high-pressure water injection unit of a water jet processing apparatus according to a second embodiment.

A water jet processing apparatus according to a second embodiment of the present invention will be described based on a drawing. FIG. 12 is a sectional view depicting the state in processing by a high-pressure water injection unit of the water jet processing apparatus according to the second embodiment. In FIG. 12, the same part as the first embodiment is given the same numeral and description thereof is omitted.

The water jet processing apparatus 1 according to the second embodiment is the same as the first embodiment except for that the shape of a blocking part 27-2 of the scattering object suction unit 25 is different from the first embodiment.

The blocking part 27-2 of the scattering object suction unit 25 of the water jet processing apparatus 1 according to the second embodiment is formed into a cylindrical shape in which the opening 271 is made on the lower side and the upper side is closed by a wall. The blocking part 27-2 is attached to the outer circumference of the tip part of the high-pressure water nozzle 21 to cover the periphery of the injection port 26. In the blocking part 27-2, the suction port 272 is made and the part other than the opening 271 and the suction port 272, including the place attached to the high-pressure water nozzle 21, is closed to surround and cover the tip part of the high-pressure water nozzle 21.

Similarly to the first embodiment, the water jet processing apparatus 1 according to the second embodiment includes the high-pressure water injection units 20, the cassette 71 that houses plural workpieces 200, the conveying unit 90 that conveys the workpiece 200 between the cassette 71 and the chuck table 10, and the alignment units 30 and thus can efficiently remove the burrs 211 made of a metal.

Third Embodiment

Figure 13:
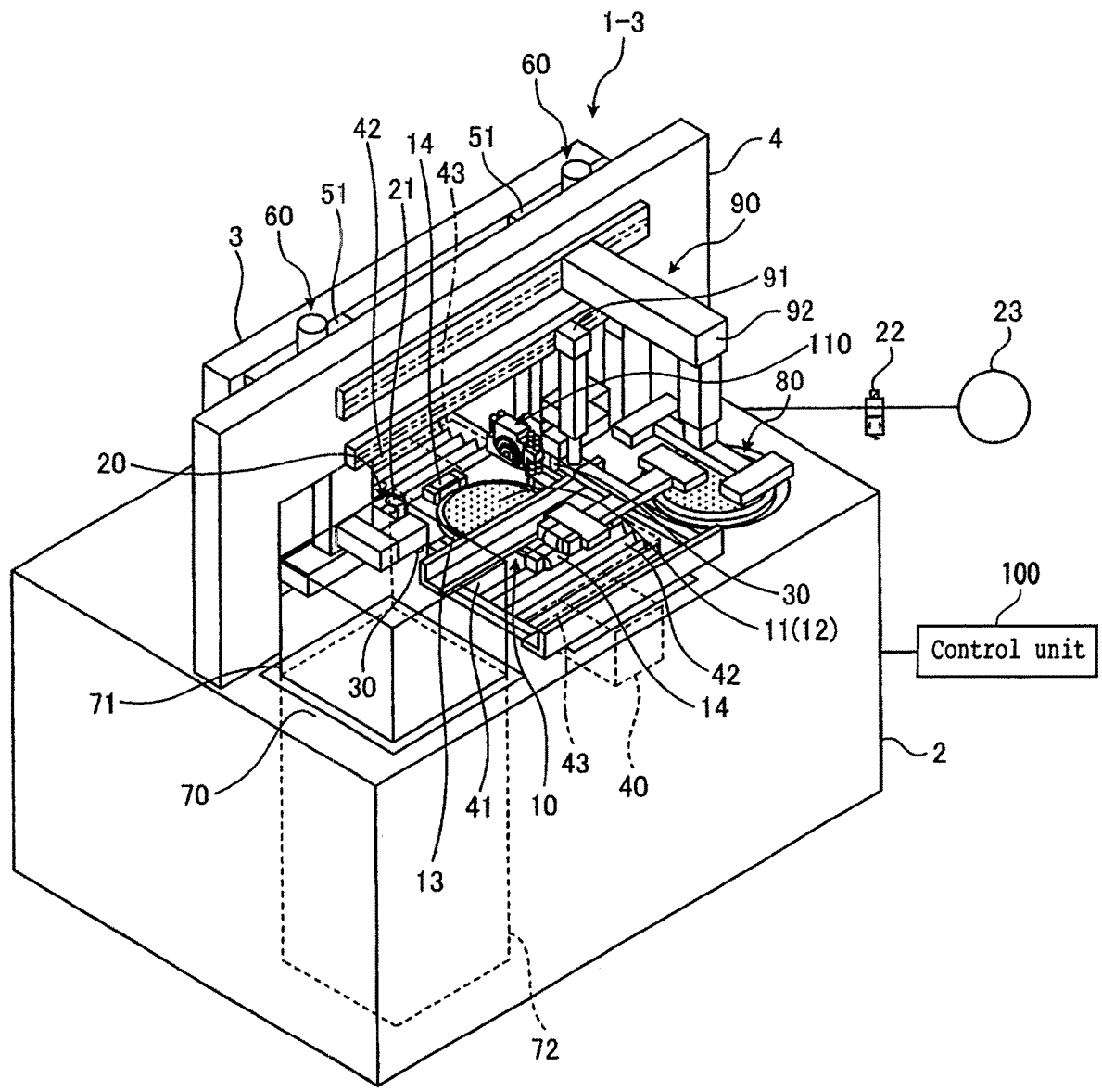
FIG. 13 is a perspective view depicting a configuration example of a water jet processing apparatus according to a third embodiment.
Figure 13:
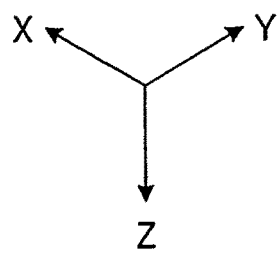

A water jet processing apparatus according to a third embodiment of the present invention will be described based on a drawing. FIG. 13 is a perspective view depicting a configuration example of the water jet processing apparatus according to the third embodiment. In FIG. 13, the same part as the first embodiment is given the same numeral and description thereof is omitted.

In a water jet processing apparatus 1-3 according to the third embodiment, the cutting unit 110 is attached to one Z-direction movement table 61 and the high-pressure water injection unit 20 is attached to the other Z-direction movement table 61. The water jet processing apparatus 1-3 fully cuts the workpiece 200 by using the cutting unit 110 after removing the burrs 211 by using the high-pressure water injection unit 20. Furthermore, the water jet processing apparatus 1-3 may remove the burrs 211 by using the high-pressure water injection unit 20 after forming the half-cut grooves 210 in the workpiece 200 by using the cutting unit 110. Thus, in addition to effects of the first embodiment, the water jet processing apparatus 1-3 can carry out the removal of the burrs 211 and the full-cutting of the workpiece 200 independently of each other and thus efficiently process the workpiece 200.

The present invention is not limited to the above-described embodiments. That is, the present invention can be carried out with various modifications without departing from the gist of the present invention. In the first to third embodiments, the workpiece 200 is a package substrate configured by arranging plural semiconductor devices on a printed circuit board and sealing the semiconductor devices by a mold resin or the like. However, in the present invention, the workpiece 200 may be a package substrate including a metal substrate on which devices for a light emitting diode (LED) are arranged. Furthermore, in the present invention, the workpiece 200 may be a circular-disc-shaped semiconductor wafer or optical device wafer containing, as the base material, silicon, sapphire, gallium, or the like that includes semiconductor devices in regions marked out in a lattice manner by plural planned dividing lines 205 formed in a surface and in which a test element group (TEG) is set in the planned dividing lines 205. In short, in the present invention, the workpiece 200 may be any object as long as it is an object in which a metal is set in the planned dividing lines 205.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A water jet processing apparatus comprising:
a chuck table that holds a workpiece by a holding surface;
a high-pressure water injection unit having a high-pressure water nozzle that injects high-pressure water along planned dividing lines of the workpiece held by the chuck table to remove adhering objects of the planned dividing lines, and a scattering object suction unit including a blocking part that surrounds and covers a tip part of the high-pressure water nozzle;
a processing feed unit that carries out processing feed of the chuck table in an X-direction parallel to the holding surface;
an indexing feed unit that carries out indexing feed of the high-pressure water nozzle in a Y-direction parallel to the holding surface;
a movement unit that moves the high-pressure water nozzle in a Z-direction along which the high-pressure water nozzle gets closer to or farther away from the holding surface;
an alignment unit that images the workpiece held by the chuck table and detects the planned dividing line;
a cassette placement region in which a cassette that houses a plurality of workpieces is placed; and
a conveying unit that conveys the workpiece between the cassette placed in the cassette placement region and the chuck table.

2. The water jet processing apparatus according to claim 1, wherein the high-pressure water nozzle includes a first high-pressure water nozzle and a second high-pressure water nozzle that are each singly subjected to indexing feed on a same straight line that extends along the Y-direction.

3. The water jet processing apparatus according to claim 1, wherein the blocking part has a cylindrical shape.

4. The water jet processing apparatus according to claim 1, further comprising:
a processing feed unit cover that covers the processing feed unit at both sides of the chuck table and is made of a metal.

5. The water jet processing apparatus according to claim 1, further comprising:
a cleaning unit that cleans the workpiece that is held by the chuck table and has been subjected to injection of the high-pressure water from the high-pressure water nozzle.

6. The water jet processing apparatus according to claim 1, wherein the scattering object suction unit further includes a suction part that communicates with the blocking part and sucks scattering objects generated due to injection of the high-pressure water.

7. The water jet processing apparatus according to claim 1, wherein the blocking part has a dome shape.

8. The water jet processing apparatus according to claim 1, wherein the workpiece includes a plurality of recesses having a predetermined depth formed along and across each of planned dividing lines, each of the recesses forming half-cut grooves when the workpiece is cut along the planned dividing lines.

9. The water jet processing apparatus according to claim 8, wherein the high-pressure water nozzle injects high-pressure water into the half-cut grooves along each of the planned dividing lines of the workpiece to remove adhering objects in the half-cut grooves.

* * * * *